(12) United States Patent
Baier et al.

(10) Patent No.: US 7,411,291 B2
(45) Date of Patent: Aug. 12, 2008

(54) COMPONENT WITH SENSITIVE COMPONENT STRUCTURES AND METHOD FOR THE PRODUCTION THEREOF

(75) Inventors: Thomas Baier, München (DE); Waldemar Gawlik, Samerberg (DE); Günter Kovacs, München (DE); Anton Leidl, Hohenbrunn (DE); Christian Math, München (DE); Werner Ruile, München (DE)

(73) Assignee: EPCOS AG (DE)

( * ) Notice: Subject to any disclaimer, the term of this patent is extended or adjusted under 35 U.S.C. 154(b) by 94 days.

(21) Appl. No.: 11/491,594

(22) Filed: Jul. 24, 2006

(65) Prior Publication Data

US 2006/0284307 A1    Dec. 21, 2006

Related U.S. Application Data

(63) Continuation of application No. PCT/EP2005/000328, filed on Jan. 14, 2005.

(30) Foreign Application Priority Data

Feb. 2, 2004    (DE) .................... 10 2004 005 129

(51) Int. Cl.
  *H01L 23/34*    (2006.01)
  *H01L 41/00*    (2006.01)
(52) U.S. Cl. .................. 257/723; 310/311; 310/313 R; 310/313 B; 310/313 D; 333/193; 333/194; 333/195

(58) Field of Classification Search ................ 257/416, 257/723, 778, E23.079, E23.169, E23.171; 310/311, 313 R, 313 B, 313 D; 333/193, 333/194, 195
See application file for complete search history.

(56) References Cited

U.S. PATENT DOCUMENTS

| 4,547,830 | A |   | 10/1985 | Yamauchi |
| 5,587,598 | A |   | 12/1996 | Hatanaka |
| 5,699,026 | A |   | 12/1997 | Kurp et al. |
| 6,365,433 | B1 |   | 4/2002 | Hyoudo et al. |
| 2001/0029650 | A1 | * | 10/2001 | Takata et al. ................ 29/25.35 |
| 2002/0000897 | A1 | * | 1/2002 | Huor ........................... 333/195 |

FOREIGN PATENT DOCUMENTS

| DE | 10220347 A1 | 11/2003 |
| WO | 01/52410 A2 | 7/2001 |

* cited by examiner

*Primary Examiner*—Minh-Loan Tran
*Assistant Examiner*—Selim Ahmed
(74) *Attorney, Agent, or Firm*—Mayback & Hoffman, P.A.; Gregory L. Mayback; Scott D. Smiley

(57) ABSTRACT

An electrical component has electrically conducting structures placed on an electrically isolating or semiconductive substrate and component structures sensitive to a voltage or an electrical arcing and galvanically separated from one another. To prevent an arcing between the galvanically separated component structures, the component structures are short-circuited with a shunt line having a smaller cross-section than the remaining electrical conductor tracks. The shunt lines can be burnt through by application of an electrical current at any given time, whereby a galvanic separation of the component structures is effected, if necessary, for the function of the component.

16 Claims, 3 Drawing Sheets

COMPONENT WITH SENSITIVE COMPONENT STRUCTURES AND METHOD FOR THE PRODUCTION THEREOF

CROSS-REFERENCE TO RELATED APPLICATIONS

This application is a continuation, under 35 U.S.C. § 120, of copending international application No. PCT/EP2005/000328, filed Jan. 14, 2005, which designated the United States and was not published in English; this application also claims the priority, under 35 U.S.C. § 119, of German patent application No. 10 2004 005 129.1, filed Feb. 2, 2004; the prior applications are herewith incorporated by reference in their entirety.

BACKGROUND OF THE INVENTION

Field of the Invention

Increasingly, problems with electrostatic charge and discharge, commonly known as electrostatic discharge (ESD) problems arise with electrical components, in particular, miniaturized electrical components with electrical conductor tracks having a small cross-section or with component structures disposed at a short distance to one another in the component. Due to small measurements or short distances, arcing caused by static electricity can take place between adjacent components when using such components. Such arcing can lead to damage or destruction of the component structures. The electrostatic charging and the voltage applied therewith on the component between different component structures can take place through an atmospheric charge due to tribo electricity, by contact with an external electrical potential. The use of materials, in particular, those having pyro-electrical or piezo-electrical characteristics, may lead to a high electrical charge due to processing steps including a temperature change or (with piezo-electrical materials) a high mechanical stress on the material.

When such voltage builds up between two component structures that are placed on highly-isolating or semiconductive materials and that are electrically isolated from one another, the voltage may lead to an electrical arcing when the breach voltage has been exceeded. The arcing takes place where the component structures that are electrically isolated from one another have the smallest distance or where a higher load density prevails due to a specific geometric molding of the component structures.

Components made up of piezo- and/or pyro-electrical materials as their substrate are particularly affected by this problem. The problem relates, particularly, to micro-acoustic components, such as SAW components, FBAR components or micro-electromechanical systems (MEMS) components. The problem is intensified by the highly-insulating characteristics of the substrate materials that prevent a natural reduction of the electro-static voltages through a high-impedance line.

Different materials are known for preventing the build-up of large electro-static voltages or for reducing electro-static voltages. In particular, components exist with high-impedance connections between sensitive component structures, for example, in the form of a high-impedance layer between component structures and substrate (see, for example, German Published, Non-Prosecuted Patent Application DE 102 203 47 A1 or European Patent No. 124 73 38 A1, corresponding to U.S. Pat. No. 6,931,699 B2 to Pahl et al.) or in the form of high-impedance electrical connections (see, for example, U.S. Pat. No. 5,699,026 to Kurp et al.). Sensitive components can be protected against slowly-mounting overvoltages with the help of such high-impedance connections. The poor performance of such components which is noticeable particularly with SAW filters in an increased insertion damping or loss as well as an increased space requirement and a lack of effect when charges are mounting rapidly is a disadvantage of this solution.

SUMMARY OF THE INVENTION

It is accordingly an object of the invention to provide a component with sensitive component structures and method for the production thereof that overcome the hereinaforementioned disadvantages of the heretofore-known devices and methods of this general type and that has component structures sensitive to overvoltages or electrostatic discharge but are protected against such damages during the entire production process in a simple manner and that avoid the mentioned disadvantages of the existing solutions.

With the foregoing and other objects in view, there is provided, in accordance with the invention, an electrical component, including a substrate selected from at least one of the group consisting of a semiconductive substrate and an electrically isolating substrate, electrical conductor tracks being at least one of on and in the substrate and having a cross-section, electrically isolating structures at least one of on and in the substrate, at least two externally accessible electrical terminals, at least two component structures selected from at least one of a group consisting of voltage-sensitive component structures and electrical-arcing-endangered component structures, at least one shunt line having a cross-section smaller than the cross-section of the electrical conductor tracks, and the substrate, the electrical conductor tracks, the electrically isolating structures, the electrical terminals, and the at least two component structures having a pre-stage state in which the at least one shunt line short-circuits the at least two component structures and is electrically connected with the electrical terminals.

With the objects of the invention in view, there is also provided an electrical component to be connected to at least two externally accessible electrical terminals, including a substrate selected from at least one of the group consisting of a semiconductive substrate and an electrically isolating substrate, electrical conductor tracks at least one of on and in the substrate and having a cross-section, electrically isolating structures at least one of on and in the substrate, at least two component structures selected from at least one of a group consisting of voltage-sensitive component structures and electrical-arcing-endangered component structures, a shunt line having a smaller cross-section than the cross-section of the electrical conductor tracks, and the substrate, the electrical conductor tracks, the electrically isolating structures, and the at least two component structures having a pre-stage state in which the shunt line short-circuits the at least two component structures and is connected with the electrical terminals.

The present invention provides an electrical component that is disposed on a semiconductive or electrically isolating substrate. Electrical conductor tracks include at least two component structures that are, typically, but not imperatively, electrically isolated from one another and that are sensitive to an electrical arcing or an electrostatic voltage.

According to the invention, such a component is improved because the at least two component structures are short-circuited in a preliminary stage of the component with a shunt line that is placed in or on the substrate and that has a smaller cross-section than the electrical conductor tracks and is connected with two electrical terminals that are externally accessible. All of the component structures of the component that are electrically isolated from one another can be short-circuited with such shunt lines so that an arcing or damage caused by static electricity is practically impossible because, due to the short-circuiting of all of the component structures, these component structures all have the same potential and internal voltages cannot built up. Such a component is, therefore, protected during the entire production process.

However, due to the short-circuit, the component function, itself, is disrupted so that the short-circuit created by the shunt line must be eliminated prior to the first operation of the component. According to the invention, such a feature can be carried out in a simple manner by overloading the shunt line with a current impulse that leads to a burn-through of the shunt line. Due to the fact that the shunt line has a smaller cross-section than the remaining conductor tracks, the burn-through can already take place at a current that is harmless for the remainder of the component and, particularly, for the remaining conductor tracks and, preferably, is in a range of currents that occur during normal operation.

The burn-through of the shunt line can, for example, take place only after full completion of the component including the assembly into a housing or any other encapsulation. The shunt line is directly or indirectly electrically contacted through two external electrical terminals, in particular, the connection pins or the connection contacts of the component, so that the current required for the burn-through of the shunt line can be applied through these terminals. This can also take place after an encapsulation or an assembly of the component into a housing. If a plurality of shunt lines are present, a potentially different voltage may also be applied on different pairs of external terminals in a temporally parallel or, if applicable, in a sequential manner for the purpose of burn-through. To achieve a burn-through of the shunt lines, it is also possible to connect a plurality of shunt lines such that only a surge must be applied to a pair of external terminals. If a plurality of shunt lines is present in the component, they can be similarly assembled or have a different assembly, geometry or metallization.

The burnt-through shunt line in the completed component does not have any disadvantages consequences and requires only a small area on the component. The burn-through of the shunt line can take place by melting or evaporation of the corresponding conductor material, whereby the energy required for doing so takes place by resistor heating in the shunt line that has an increased electrical resistance in the reduced cross-section.

The invention makes it possible to connect and short-circuit all of the sensitive or endangered component structures, or even all of the electrically conducting structures that are separated from one another by one or a plurality of shunt lines that can be easily removed.

Advantageously, it is possible to embody only a relatively short section with a reduced cross-section in the shunt line. Such a configuration leads to a predetermined breaking point that can be placed on the substrate at a desired location. The shunt line, itself, can then be substantially longer to, if applicable, correspondingly connect component structures located at a far distance from one another. In doing so, it is also possible to secure floating electrically conducting structures that are not connected with an external contact with the help of a shunt line without affecting the component function.

Preferably, the shunt line can be disposed between electrical terminal surfaces on the substrate. Due to the fact that these terminal surfaces are typically electrically connected with the external terminals of the component, the electrical responsiveness of the shunt line during the burn-through is, thus, also ensured. With such shunt lines, all of the metallizations that are connected with the terminal surfaces can be short-circuited.

During the production of the component, the shunt line is generated in an earliest possible production process, preferably, together with the first metallization where further conductor tracks and component structures are also created for the actual component function. Such a configuration has the advantage that the production of the shunt line does not require its own process step and that the component is protected during the production by a maximum number of method steps. Accordingly, the shunt lines also, preferably, are of the same metallization as the remaining conductor tracks. The shunt lines can be produced, for example, by lithography.

For a safe burn-through of only the shunt line, it is sufficient to halve its conductor cross-section at least in one section. During the lead-through of the current impulse for the burn-through of the shunt line, the thus doubled resistance leads to admission of energy that is sufficient for melting or evaporating the conductor material, without endangering the remaining conductor tracks that are present, for example, with a double cross-section.

A reduction of the conductor track cross-section can be carried out, for example, by making the width of the conductor track used for the shunt line smaller than that of the remaining conductor tracks. However, it is also possible to reduce the metallization thickness in the area of the shunt line. Naturally, in addition to the mentioned bisection, a smaller or a higher reduction of the conductor track cross-section of the shunt line is possible. A reduction of the metallization thickness in the area of the shunt line is advantageous when the lithography used for the generation of the metallization does not enable additional structure reductions and, thus, a reduction of the conductor track width. If the metallization is produced in a two-layer or multi-layer manner in a multi-step process, for example, one of these steps can be dispensed with to reduce the metallization thickness of the shunt line.

Advantageously, the shunt line is placed on the surface of the substrate, for example, on an uncovered surface. Such placement ensures that the evaporating conductor material can escape or maximally disperse unhindered, without causing additional short-circuits. However, it is also possible to place the shunt line or at least the section of the shunt line with the reduced cross-section within a hollow space to provide room for the melting bead after the melting of the shunt line during a mere melting of the shunt line.

The invention offers particular advantages for electrical components, whose substrates include materials with pyro-electrical or piezo-electrical characteristics. Pyro-electrical materials create a voltage during temperature changes, as are inevitable in most method steps during the production of the component. With a mechanical load that can also appear during the production of such components, piezo-electrical materials create a voltage. If, for example, the component is produced on a wafer plane, a singling that is carried out, preferably, by sawing is necessary. Only the sawing process can lead to piezo-electrical voltages and tribo-electricity produced by the friction can be intensified. The present invention safely prevents, as a result of these processes, different potentials from building up so that electrical arcing and damage caused by high voltages can be prevented in the component.

However, not only piezo- and pyro-electrical substrate materials lead to a build-up of high electrostatic voltages. Electrostatic loads also can be created in semiconductive components or components assembled on other electrically isolating substrates, and, depending on the configuration of the electrically conductive structures, can also lead to an electrostatic arcing and damage. Components according to the invention, thus, can also include semiconductor components, in particular, miniaturized integrated circuits, miniaturized sensors, micro-electromechanical systems, and micro-optical components.

A component with burnt-through shunt line is also envisioned in the present invention, as this can fulfill the desired component function.

In accordance with another feature of the invention, all of the component structures are short-circuited with a shunt line. The at least one shunt line can be a plurality of shunt lines and the at least two component structures are short-circuited with the shunt lines. All of the component structures can be short-circuited with the shunt lines. The at least two component structures can be a plurality of component structures and the plurality of component structures are short-circuited with the shunt lines.

In accordance with a further feature of the invention, the electrical terminals have surfaces, the electrical conductor tracks connect the component structures to the surfaces of the electrical terminals, and the surfaces are short-circuited with the at least one shunt line.

In accordance with an added feature of the invention, the electrical terminals have surfaces, e electrical conductor tracks connect all of the component structures to the surfaces of the electrical terminals and he surfaces are short-circuited with the at least one shunt line.

In accordance with an additional feature of the invention, the shunt line is on the surface of the substrate.

In accordance with yet another feature of the invention, the substrate is of a ceramic selected from at least one of the group consisting of an LTCC ceramic and an HTCC ceramic.

In accordance with yet a further feature of the invention, each of the surfaces of the electrical terminals have a wedge-shaped metal surface with a peak, peaks of two of the surfaces face one another, and the facing peaks of the two surfaces of the electric terminals are connected to one another through the at least one shunt line.

In accordance with yet an added feature of the invention, the substrate, the electrical conductor tracks, the electrically isolating structures, the electrical terminals, and the at least two component structures form a component, the component has a housing selected from one of the group consisting of a MEMS component, an SA component, and an FBAR component, and the at least one shunt line is disposed within the housing.

In accordance with yet an additional feature of the invention, the substrate, the electrical conductor tracks, the electrically isolating structures, the electrical terminals, and the at least two component structures have a ready-stage state in which the at least one shunt line is burnt-through and, thus, is electrically interrupted.

With the objects of the invention in view, there is also provided a method for producing an electrical component that is sensitive to electrostatic discharge (ESD), including the steps of applying a structured metallization at a substrate to create component structures including electrical conductor tracks at least one of on and in the substrate, at least two of the component structures being electrically separated from one another, providing at least two electrical terminals at the substrate accessible from outside the substrate, providing at least one shunt line at the substrate, the at least one shunt line having at least one portion in which a line cross-section thereof is smaller than a cross-section of the electrical conductor tracks, electrically short-circuiting two of the electrically separated component structures, and running between two of the at least two electrical terminals. The shunt line, the terminals, the substrate, and the component structures form a completed component. After forming the completed component, a current is applied to the electrical terminals connected with the shunt line sufficient to burn through the portion of the shunt line having the reduced cross-section and, thus, remove the short-circuit.

In accordance with again another mode of the invention, the at least two electrical terminals are provided as a plurality of electrical terminals and the at least one shunt line is provided as a plurality of shunt lines. Current is sequentially applied in a plurality of steps to electrical terminal pairs connected to corresponding ones of the plurality of shunt lines sufficient to cause a burn-through in the corresponding ones of the shunt lines.

In accordance with again a further mode of the invention, the at least two electrical terminals are provided as a plurality of electrical terminals and the at least one shunt line are provided as a plurality of shunt lines. Current is applied in a plurality of steps to at least electrical terminal pairs to burn-through the shunt lines.

In accordance with again an added mode of the invention, the burn-through of the at least one shunt line is controlled by increasingly applying the current to the terminals until the current breaks down the at least one shunt line. Then, the current applied to the terminals is removed.

In accordance with a concomitant mode of the invention, there are provided the steps of the substrate is provided as a wafer, the application step is carried out by applying the metallization in a plurality of component regions on the wafer, the wafer is separated into individual components in a line of production, and the component structures are short-circuited with the shunt line only within one respective component region.

Other features that are considered as characteristic for the invention are set forth in the appended claims.

Although the invention is illustrated and described herein as embodied in a component with sensitive component structures and method for the production thereof, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 6A is a fragmentary, block circuit diagram of a plurality of shunt lines according to the invention connected with one another prior to a burn-through;

FIG. 6B is a fragmentary, block circuit diagram of a plurality of shunt lines of FIG. 6A connected with one another after the burn-through.

DESCRIPTION OF THE PREFERRED EMBODIMENTS

Figure 1:
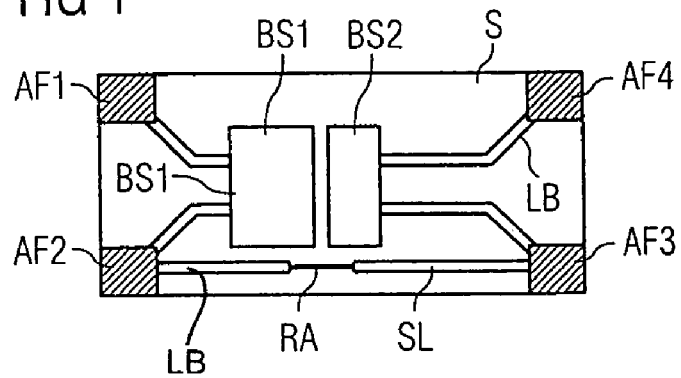
FIG. 1 is a fragmentary, diagrammatic plan view of a substrate of a component according to the invention with two component structures and a shunt line.

Referring now to the figures of the drawings in detail and first, particularly to FIG. 1 thereof, there is shown, in a schematic top view, the substrate S of a component on which component structures BS1 and BS2 are indicated and represent, for example, two metallizations. In the exemplary embodiment, the first component structure BS1 is connected with electrical terminal surfaces AF1 and AF2. The second component structure BS2 is connected with electrical terminal surfaces AF3 and AF4, in each case with the help of conductor tracks LB, whereby all elements are located on the surface of the substrate S.

During normal operation of the component, the two component structures BS1, BS2 are galvanically separated, but located closely adjacent one another. Consequently, an electrical arcing can take place between the two component structures, if, due to electrostatic charging of one of the two structures, for example, the burn-through voltage is exceeded. According to the invention, the two component structures are, thus, electrically short-circuited with a shunt line SL that connects between the terminal surfaces AF2, AF3, for example. Here, the shunt line SL includes a section that is embodied as a normal conductor track. Furthermore, the shunt line SL includes a section RA having conductor track cross-section that is smaller than that of the remaining conductor tracks. In the illustrated example, the reduced cross-section is achieved by a reduced width.

In addition to the illustrated shunt line SK, it is possible to provide additional shunt lines, for example, between the terminal surfaces AF1 and AF4. The terminal surfaces AF1 and AF2, or AF3 and AF4, respectively, can also each be connected with a shunt line. Additional shunt lines are necessary, for example, when the component structures BS represent only a high-impedance connection between the terminal surfaces AF1 and AF2 or when the component structure does not at all ensure a galvanic connection between the two terminal surfaces AF1 and AF2 or AF3 and AF4, respectively. In such cases, additional shunt lines SL are necessary. A plurality of even different shunt lines SL can come from every terminal surface AF or every metallization structure of the component and can connect these shunt lines with different metallization structures.

Figure 2:
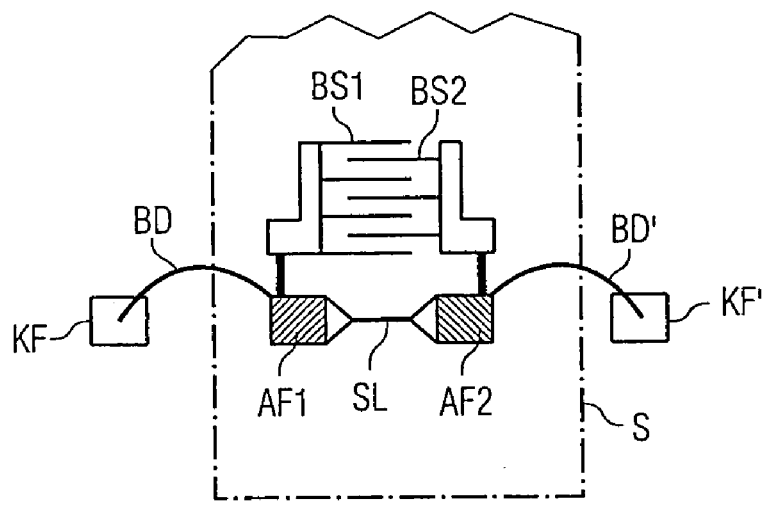
FIG. 2 is a fragmentary, diagrammatic schematic illustration of the substrate of a specific component with a shunt line according to the invention.

As a specific exemplary embodiment for a sensitive component structure BS, FIG. 2 shows an interdigital transducer of a surface wave (SAW) component. The component is assembled on the surface of a piezo-electric substrate S in the form of metallizations. The interdigital transducer is of two interdigital combs that represent two component structures BS1, BS2 that are sensitive to arcing. The two electrode combs with electrode fingers embodied as metallic strips are pushed behind one another, whereby the electrode fingers of different component structures have only a small distance from one another. An electrostatic potential applied at one of the two component structures BS1, BS2 can easily lead to an electrical break-through between the closely adjacent electrode fingers of the two component structures BS1, BS2.

The component structures are connected with terminal surfaces AF1 and AF2 by electrical conductor tracks. According to the invention, a shunt line SL that bridges the two terminal surfaces is provided between the two terminal surfaces AF1 and AF2, which are galvanically separated in the component. A further detail is illustrated in FIG. 2 in that, on the sides facing one another, the terminal surfaces AF1, AF2 are expanded by a wedge-shaped metallized surface, the peaks of which face one another. The peaks are connected through the shunt line SL. Both component structures BS1, BS2 are, thus, electrically short-circuited. Therefore, the substrate with the component structures can be further processed without running the risk of a break-through.

In line with the further processing, the substrate can be assembled, for example, into a housing, whereby the terminal surfaces AF are connected with the external contact surfaces of the housing or of a base substrate. For such a purpose, FIG. 2 illustrates, for example, a connection through a bonding wire BD. The bonding wire BD connects the terminal surfaces with the contact surfaces KF of the housing that are, in turn, electrically connected with the external contacts of the entire component. However, the substrate S with the component structures BS can also be placed on a housing bottom or on a carrier substrate through bump connections in flip-chip configuration, whereby, in this non-illustrated exemplary embodiment, the terminal surfaces AF with congruently placed contact surfaces are connected on the carrier substrate or the housing bottom in an electrically conducting and mechanically firm manner through the bumps.

In line with the further processing, the substrate can finally be covered with a cap, for example, that can sit directly on the substrate or with a housing upper part that can sit on the housing bottom part or on a base plate. A flip-chip configuration can also be covered with a foil or coating that bears directly on the back side of the substrate. Nevertheless, it is ensured that, even after being housed, the terminal surfaces AF are accessible from the outside through the external contacts or the contact surfaces KF, respectively. This is necessary because disconnection of the shunt line SL can be carried out by a suitable surge at any time, in particular, after the final completion of the component.

Figure 3:
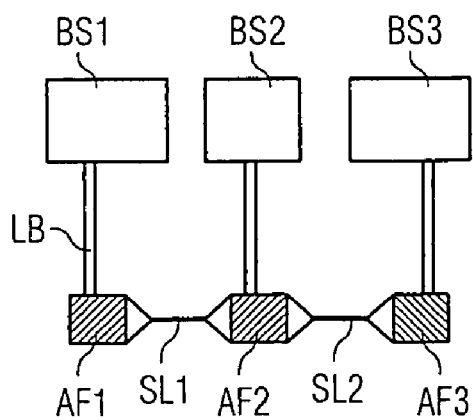
FIG. 3 is a block circuit diagram of component structures with a plurality of shunt lines according to the invention.

FIG. 3 shows a further exemplary embodiment of the invention, where three or more component structures BS1, BS2, BS3 that are galvanically separated from one another in the operational component are placed on the substrate. Each of the component structures BS1, BS2, BS3 is connected with at least one terminal surface AF1, AF2, AF3. Two of each of the terminal surfaces are short-circuited here by a shunt line SL, whereby the shunt line SL1 connects the terminal surfaces AF1 and AF2, and the shunt line SL2 connects the terminal surfaces AF2 and AF3 with one another.

The shunt lines are separated at any given time during or, preferably, after the completion of the entire component that can include the application of further structures, layers, or covers.

For such a purpose, a voltage leading to a controlled current flow between the two terminal surfaces AF1 and AF2, is applied to the terminal surfaces AF1, AF2 under controlled conditions. The current flow is chosen to be sufficiently large so that the heating of the shunt line, caused by the increased resistance of the shunt line, leads to a melting or evaporating of the conductor track material. Thus, the current flow is interrupted and the voltage increases. The, the terminal surfaces are separated from the current supply or the potential, respectively, to prevent an overvoltage between the now galvanically separated component structures BS1 and BS2. The same burn-through process is, now, also carried out for the shunt line SL2 by applying a voltage to the terminal surfaces AF2 and AF3. As a consequence, all three component structures BS1, BS2, BS3 are now galvanically separated from one another. It is thereby possible that only two of the terminal surfaces are used for the component function in the subsequent component, for example, the terminal surfaces AF1 and AF3. The component structure BS2 can represent a floating metallization not having any contact with the external potential during the component operation. The terminal surface AF2 is, then, connected with an external terminal exclusively for separating the corresponding shunt lines SL1, SL2 to apply a corresponding voltage at the external terminal.

In a further embodiment of the invention, it is possible to directly connect the conductor tracks LB with a shunt line. The shunt line can, thereby, bridge the shortest possible distance between the two metallizations to be connected, whereby, in this case, the minimally required substrate surface is advantageous here. However, it is also possible to embody the shunt line or the shunt lines in any length and in any form. For example, it is possible to embody the shunt line as a meandering structure.

Mostly, however, it is advantageous to minimize metallization area and metallization thickness of the shunt line to not build up additional parasitic capacities in the component that could influence the component function. It is also possible to connect the component structures BS themselves with the terminal surfaces AF through shunt lines SL. This is of particular advantage when the electrical terminal of the component structures does not take place through the terminal surfaces AF, but is carried out at a different location of the component structure, for example, through bond wire connections or through bump connections.

Figure 4:
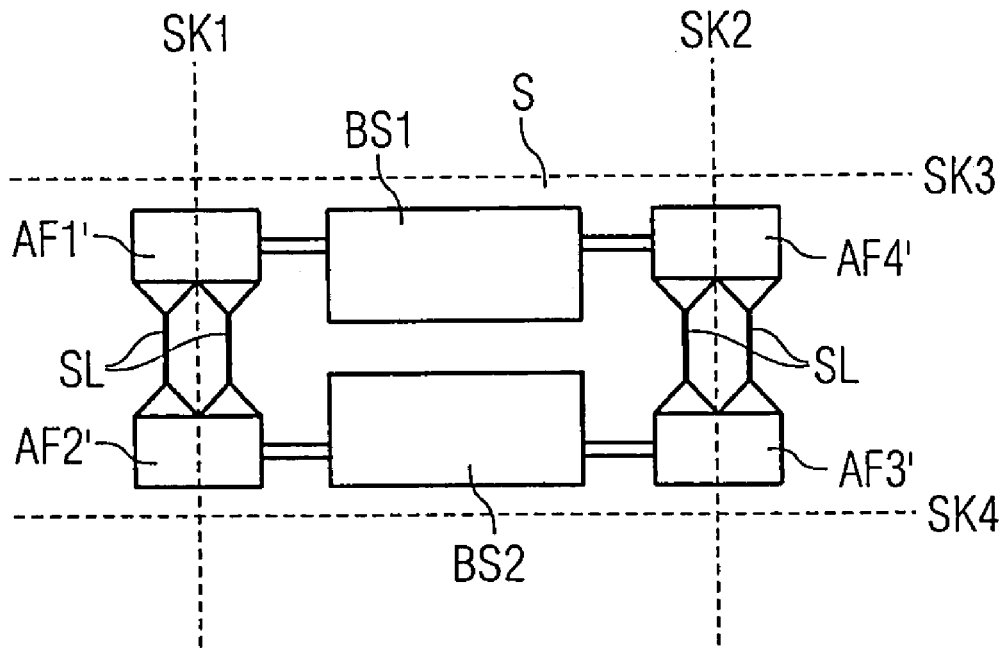
FIG. 4 is a fragmentary, block circuit diagram of a metallization according to the invention on a wafer.

FIG. 4 shows a further embodiment of the invention, where the metallization is carried out on a wafer plane for the generation of the component structures BS, the conductor tracks LB, the terminal surfaces AF, and the shunt lines SL. The substrate S is, then, a wafer on which different component regions are separated from one another by the cutting edges SK illustrated by dashed lines. Corresponding component structures and other conducting structures are applied in one step, temporally parallel in every component region. FIG. 4 schematically suggests only the structures of a single component region, i.e., two galvanically separated component structures BS1 and BS2. A plurality of terminal surfaces AF are placed on the wafer so that they overlap a cutting edge SK and, thus, belong to two adjacent component regions at the same time. The terminal surfaces are galvanically connected with the component structures BS. Two adjacent terminal surfaces that are galvanically separated in the completed component are connected with one another through shunt lines SL. The component structures of adjacent component regions are, thus, galvanically connected with one other by terminal surfaces AF that simultaneously belong to two component regions so that all of the metallic structures can be galvanically connected with one another in all of the component regions on the entire wafer surface.

The components are separated in a subsequent processing step in that the wafer is disconnected along the cutting edges SK, for example, by sawing. During the disconnection, the terminal surfaces AF are divided, whereby each half belongs to one of the two then separated component regions or separated component, respectively. If two adjacent terminal surfaces AF1', AF2' are each connected with one another through two shunt lines SL that are placed on both sides of the cutting edge SK1 located therebetween, the terminal surfaces of the disconnected substrates are still short-circuited through the shunt line SL, even after the separation. This means that, for example, during the entire sawing process that leads to a mechanical stress of the substrate, no static electricity can lead to a build-up of potential differences between adjacent component structures BS. Here, the individual components can, subsequently, be further processed and, where required, incorporated into a housing. The separation of the shunt lines can take place at any point in time, preferably, immediately prior to a measuring process that is generally carried out for every component at the final inspection. The components are operational only afterwards and will nor longer be short-circuited by the shunt lines SL.

In an embodiment of the invention, it is also possible to separate different shunt lines at different points in time, or in different process steps, depending on what is required by the component geometry and the processing of the components. In an adapted embodiment, similar to FIG. 4, the component structures BS are connected with the terminal surfaces AF through shunt lines, while the terminal surfaces AF are connected among each other by a massive conductor track or by an electrically conducting frame. In such an exemplary embodiment, the frame leads to a short-circuiting of all of the terminal surfaces, while the component structures are connected with the terminal surfaces only through the shunt lines. As is also the case in this exemplary embodiment, the shunt line can only be separated at the end of all of the production processes by a burn-through.

Figure 5:
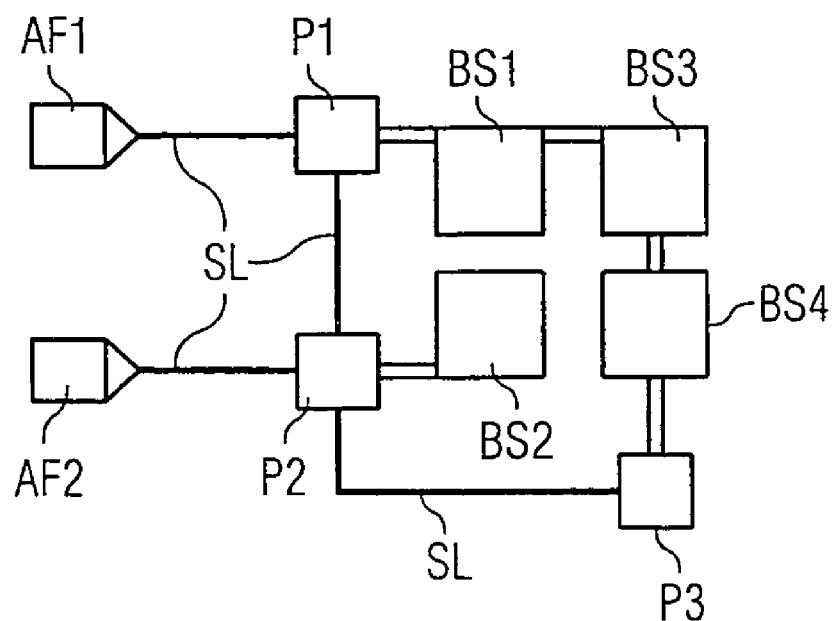
FIG. 5 is a block circuit diagram of component structures with a plurality of shunt lines according to the invention.

FIG. 5 shows, in a schematic top view, a further embodiment of the present invention where a plurality of different component structures BS1 to BS4 are short-circuited through different shunt lines SL. For example, the shunt lines SL connect, pads P1, P2, P3, P4 placed in the vicinity of the component structures with the terminal surfaces AF1, AF2, AF3, AF4. A plurality of shunt lines SL can also come from individual pads P2.

Figure 6A:
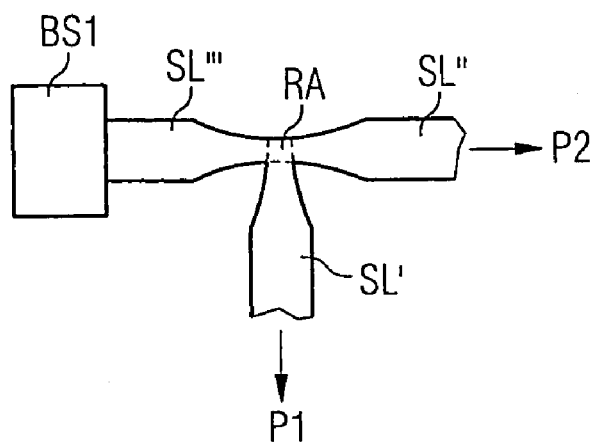

FIG. 6A shows, in schematic top view, a possibility for connecting a component structure without electrical connection to external terminals during operation, a so-called floating metallization, or component structures to other component structures by only one shunt line. A shunt line is made of the sections SL' and SL" being directly or indirectly electrically connected with terminals, for example, with corresponding pads P1 and P2. At one point RA, the cross-section of the shunt line is reduced. At that point RA, yet a further section SL''' of a shunt line connected with the floating component structure BS1, is connected.

Figure 6B:
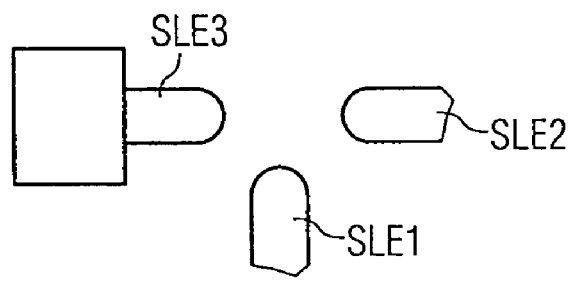

A current leading to a melting or evaporating of conductor material in section RA, is applied through the pads P1 and P2 for the purpose of burn-through of these shunt lines. Thereby, all three sections SL', SL", and SL''' are electrically separated. FIG. 6B shows the configuration after burn-through.

Figure 7:
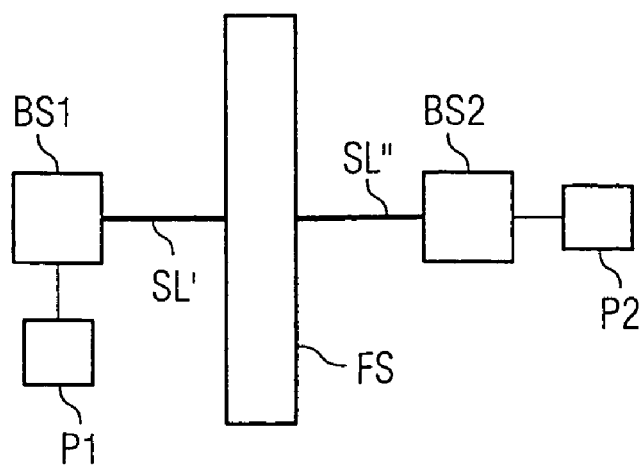
FIG. 7 is block circuit diagram of component structures with shunt lines according to the invention that bridge a floating metallization.

FIG. 7 illustrates an exemplary possibility for bridging a floating metal structure FS with two sections SL' and SL" of a shunt line SL. Such a configuration may be necessary when a pad is surrounded by a floating metal structure, for example, by a grounding frame or a magnetic shielding structure. During burn-through, both sections SL' and SL" can be disconnected at the same time.

Even though the present invention has been illustrated with only few exemplary embodiments, it is not limited thereto. The present invention includes further non-illustrated embodiments that differ from the illustrated exemplary embodiments with reference to number, configuration, and embodiment of the shunt lines. However, what is similar in each embodiment is that component structure that are galvanically separated from one another are short-circuited and, thus, protected against an electrical arcing by the shunt line in the completed component.

We claim:

1. An electrical component, comprising:
a substrate selected from at least one of the group consisting of a semiconductive substrate and an electrically isolating substrate;
electrical conductor tracks being at least one of on and in said substrate and having a cross-section;
electrically isolating structures at least one of on and in said substrate;
at least two externally accessible electrical terminals;
at least two component structures selected from at least one of a group consisting of voltage-sensitive component structures and electrical-arcing-endangered component structures;
at least one shunt line having a cross-section smaller than said cross-section of said electrical conductor tracks; and
said substrate, said electrical conductor tracks, said electrically isolating structures, said electrical terminals, and said at least two component structures having a pre-stage state in which said at least one shunt line short-circuits said at least two component structures and is electrically connected with said electrical terminals.

2. The component according to claim 1, wherein all of said component structures are short-circuited with said at least one shunt line.

3. The component according to claim 1, wherein:
said at least one shunt line is a plurality of shunt lines; and
said at least two component structures are short-circuited with said shunt lines.

4. The component according to claim 1, wherein:
said at least one shunt line is a plurality of shunt lines; and
all of said component structures are short-circuited with said shunt lines.

5. The component according to claim 1, wherein:
said at least one shunt line is a plurality of shunt lines;
said at least two component structures is a plurality of component structures; and
said plurality of component structures are short-circuited with said shunt lines.

6. The component according to claim 1, wherein said at least one shunt line has at least one portion with a reduced cross-section.

7. The component according to claim 1, wherein:
said electrical terminals have surfaces;
said electrical conductor tracks connect said component structures to said surfaces of said electrical terminals; and
said surfaces are short-circuited with said at least one shunt line.

8. The component according to claim 1, wherein:
said electrical terminals have surfaces;
said electrical conductor tracks connect all of said component structures to said surfaces of said electrical terminals; and
said surfaces are short-circuited with said at least one shunt line.

9. The component according to claim 1, wherein said at least one shunt line and said conductor tracks are of the same metallization.

10. The component according to claim 1, wherein:
said substrate has a surface; and
said at least one shunt line is on said surface of said substrate.

11. The component according to claim 1, wherein said substrate is of a material having electrical characteristics selected from at least one of the group consisting of pyro-electrical characteristics and piezo-electrical characteristics.

12. The component according to claim 1, wherein said substrate is of a ceramic selected from at least one of the group consisting of an LTCC ceramic and an HTCC ceramic.

13. The component according to claim 7, wherein:
each of said surfaces of said electrical terminals have a wedge-shaped metal surface with a peak;
peaks of two of said surfaces face one another; and
said facing peaks of said two surfaces of said electric terminals are connected to one another through said at least one shunt line.

14. The component according to claim 1, wherein:
said substrate, said electrical conductor tracks, said electrically isolating structures, said electrical terminals, and said at least two component structures form a component;
said component has a housing selected from one of the group consisting of a MEMS component, an SA component, and an FBAR component; and
said at least one shunt line is disposed within said housing.

15. The component according to claim 1, wherein said substrate, said electrical conductor tracks, said electrically isolating structures, said electrical terminals, and said at least two component structures have a ready-stage state in which said at least one shunt line is burnt-through and, thus, is electrically interrupted.

16. An electrical component to be connected to at least two externally accessible electrical terminals, comprising:
a substrate selected from at least one of the group consisting of a semiconductive substrate and an electrically isolating substrate;
electrical conductor tracks at least one of on and in said substrate and having a cross-section;
electrically isolating structures at least one of on and in said substrate;
at least two component structures selected from at least one of a group consisting of voltage-sensitive component structures and electrical-arcing-endangered component structures;
a shunt line having a smaller cross-section than said cross-section of said electrical conductor tracks; and
said substrate, said electrical conductor tracks, said electrically isolating structures, and said at least two component structures having a pre-stage state in which said shunt line short-circuits said at least two component structures and is connected with said electrical terminals.

* * * * *